(12) United States Patent
Cheng et al.

(10) Patent No.: US 10,014,322 B2
(45) Date of Patent: Jul. 3, 2018

(54) LOCAL SOI FINS WITH MULTIPLE HEIGHTS

(71) Applicant: International Business Machines Corporation, Armonk, NY (US)

(72) Inventors: Kangguo Cheng, Schenectady, NY (US); Joel P. de Souza, Putnam Valley, NY (US); Ali Khakifirooz, Los Altos, CA (US); Alexander Reznicek, Troy, NY (US); Dominic J. Schepis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/446,632

(22) Filed: Mar. 1, 2017

(65) Prior Publication Data

US 2017/0179163 A1   Jun. 22, 2017

Related U.S. Application Data

(62) Division of application No. 14/712,516, filed on May 14, 2015, now Pat. No. 9,590,077.

(51) Int. Cl.
*H01L 21/76* (2006.01)
*H01L 21/336* (2006.01)
(Continued)

(52) U.S. Cl.
CPC ...... *H01L 27/1211* (2013.01); *H01L 21/2251* (2013.01); *H01L 21/76243* (2013.01);
(Continued)

(58) Field of Classification Search
CPC ......... H01L 21/76243; H01L 21/76245; H01L 29/785; H01L 21/66795; H01L 21/66818;
(Continued)

(56) References Cited

U.S. PATENT DOCUMENTS 5,950,094 A   9/1999  Lin et al.
6,642,090 B1  11/2003 Fried et al.
(Continued)

OTHER PUBLICATIONS

List of IBM Patents or Patent Applications Treated As Related dated Mar. 1, 2017, 2 pages.

*Primary Examiner* — Fernando L Toledo
*Assistant Examiner* — Aaron Gray
(74) *Attorney, Agent, or Firm* — Scully, Scott, Murphy & Presser, P.C.; Steven J. Meyers

(57) ABSTRACT

A semiconductor structure is provided that contains silicon fins having different heights, while maintaining a reasonable fin height to width ratio for process feasibility. The semiconductor structure includes a first silicon fin of a first height and located on a pedestal portion of a first oxide structure. The structure further includes a second silicon fin of a second height and located on a pedestal portion of a second oxide structure. The first oxide structure and the second oxide structure are interconnected and the second oxide structure has a bottommost surface that is located beneath a bottommost surface of the first oxide structure. Further, the second height of the second silicon fin is greater than the first height of the first silicon fin, yet a topmost surface of the first silicon fin is coplanar with a topmost surface of the second silicon fin.

19 Claims, 8 Drawing Sheets

(51) Int. Cl.
   *H01L 27/12* (2006.01)
   *H01L 29/06* (2006.01)
   *H01L 29/167* (2006.01)
   *H01L 29/78* (2006.01)
   *H01L 29/36* (2006.01)
   *H01L 21/225* (2006.01)
   *H01L 21/762* (2006.01)
   *H01L 21/84* (2006.01)

(52) U.S. Cl.
   CPC ........ *H01L 21/845* (2013.01); *H01L 29/0642* (2013.01); *H01L 29/167* (2013.01); *H01L 29/36* (2013.01); *H01L 29/785* (2013.01)

(58) Field of Classification Search
   CPC ........... H01L 21/823431; H01L 21/845; H01L 21/0924
   USPC ......... 257/347, 368, 506, E27.112; 438/151, 438/294, 409
   See application file for complete search history.

(56) References Cited

U.S. PATENT DOCUMENTS

| | | | |
|---|---|---|---|
| 6,872,647 | B1 | 3/2005 | Yu et al. |
| 7,101,772 | B2 | 9/2006 | Houston et al. |
| 7,172,930 | B2 | 2/2007 | Adam et al. |
| 7,566,482 | B2 | 7/2009 | Choe et al. |
| 8,263,462 | B2 | 9/2012 | Hung et al. |
| 8,476,137 | B1 | 7/2013 | LiCausi et al. |
| 8,674,449 | B2 | 3/2014 | Zhu et al. |
| 8,766,363 | B2 | 7/2014 | Cheng et al. |
| 8,815,659 | B2 | 8/2014 | Chi et al. |
| 8,896,067 | B2 | 11/2014 | Bergendahl et al. |
| 8,987,823 | B2 | 3/2015 | Cheng et al. |
| 2010/0006985 | A1* | 1/2010 | DeSouza ............ H01L 21/76245 257/647 |
| 2013/0049136 | A1 | 2/2013 | Wahl et al. |
| 2014/0124860 | A1* | 5/2014 | Cheng ................... H01L 21/845 257/347 |
| 2014/0357034 | A1 | 12/2014 | Cheng et al. |

* cited by examiner

LOCAL SOI FINS WITH MULTIPLE HEIGHTS

BACKGROUND

The present application relates to a semiconductor structure and a method of forming the same. More particularly, the present application relates to a semiconductor structure containing silicon fins located on an oxide structure and having different heights, yet having topmost surfaces that are coplanar with each other. The present application also provides a method of forming such a semiconductor structure.

For more than three decades, the continued miniaturization of metal oxide semiconductor field effect transistors (MOSFETs) has driven the worldwide semiconductor industry. Various showstoppers to continue scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, silicon fin field effect transistors (FinFETs) is the next step in the evolution of complementary metal oxide semiconductor (CMOS) devices. Silicon fin field effect transistors (FETs) can achieve higher drive currents with increasingly smaller dimensions as compared to conventional planar FETs.

Double-gated FinFETs allow the scaling to continue for the next two to three generations. However, due to the three-dimensional nature of the device, the device width (in this case fin height) cannot be varied as desired. For example and in SRAM devices, the device width ratio for pull-up and pull-down FET devices is an important parameter. In conventional (i.e., planar) circuits, this ratio can be randomly chosen by the designers to benefit the circuits even with cell size constrains. However, the device width for FinFETs is determined by the number of fins (n Fins) times (X) the fin height (h Fin) and designers cannot use as many fins as they wish due to cell size (footprint) constrains, hence the FinFET device width ratio is limited in FinFET circuits.

In view of the above, the is a need to provide a semiconductor structure containing silicon fins having different heights, while maintaining a reasonable fin height to width ratio for process feasibility.

SUMMARY

In one aspect of the present application, a method of forming a semiconductor structure containing silicon fins of different heights, while maintaining a reasonable fin height to width ratio is provided. In accordance with an embodiment of the present application, the method includes providing a bulk semiconductor substrate of, from bottom to top, a silicon base layer having a p-type conductivity and a first dopant concentration, and a boron doped silicon layer having a second dopant concentration that is less than the first dopant concentration. Next, a first set of first silicon fins of a first height is provided extending upward from a first remaining portion of the boron doped silicon layer, and a second set of silicon fins of a second height that is greater than the first height is provided extending upward from a second remaining portion of the boron doped silicon layer.

In accordance with the present application, a topmost surface of each first silicon fin is coplanar with a topmost surface of each second silicon fin, and an upper portion of each first silicon fin and an upper portion of each second silicon fin is protected by at least one sacrificial spacer, while a bottom portion of each first silicon fin and each second silicon fin is exposed. The method continues by forming a first boron doped region of a third dopant concentration in the exposed bottom portion of each first silicon fin and an upper portion of the first remaining portion of the boron doped silicon layer and a second boron doped region of the third dopant concentration in the exposed bottom portion of each second silicon fin and an upper portion of the second remaining portion of the boron doped silicon layer, wherein the third dopant concentration is greater than the second dopant concentration. Next, the first boron doped region of the third dopant concentration is converted into a first porous silicon region and the second boron doped region is converted into a second porous silicon region. The first porous silicon region is then converted into a first oxide structure and the second porous silicon region is then converted into a second oxide structure, wherein the first and second oxide structures are interconnected. Next, the at least one sacrificial spacer is removed from the first and second silicon fins.

In another aspect of the present application, a semiconductor structure is provided that contains silicon fins having different heights, while maintaining a reasonable fin height to width ratio for process feasibility. In one embodiment of the present application, the semiconductor structure includes a first silicon fin of a first height and located on a pedestal portion of a first oxide structure. The structure further includes a second silicon fin of a second height and located on a pedestal portion of a second oxide structure. In accordance with the present application, the first oxide structure and the second oxide structure are interconnected and the second oxide structure has a bottommost surface that is located beneath a bottommost surface of the first oxide structure. In further accordance with the present application, the second height of the second silicon fin is greater than the first height of the first silicon fin, yet a topmost surface of the first silicon fin is coplanar with a topmost surface of the second silicon fin. A boron doped silicon portion of a second dopant concentration is located directly beneath the first oxide structure and the second oxide structure. A silicon base layer having a p-type conductivity and of first dopant concentration is located beneath the boron doped silicon portion, wherein the first dopant concentration is greater than the second dopant concentration.

DETAILED DESCRIPTION

Figure 1:
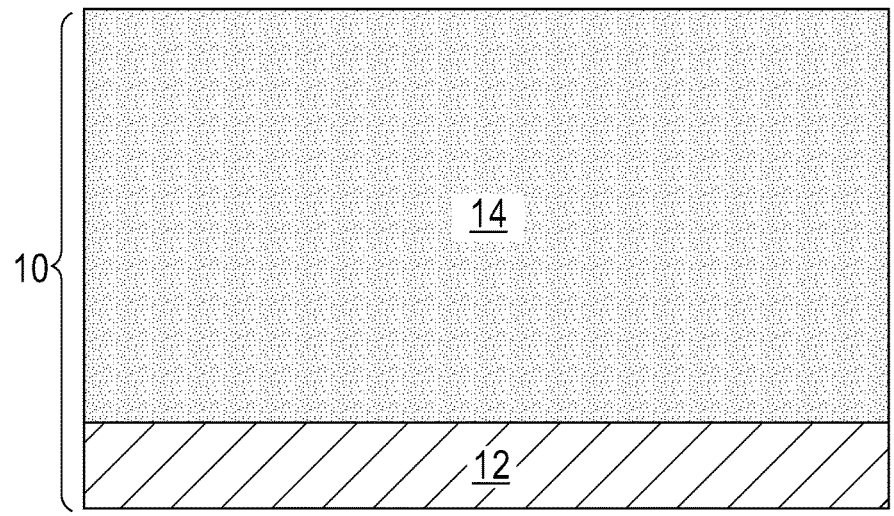
FIG. 1 is a cross sectional view of an exemplary semiconductor structure including a bulk semiconductor substrate of, from bottom to top, a silicon base layer having a p-type conductivity and a first dopant concentration, and a boron doped silicon layer having a second dopant concentration that is less than the first dopant concentration in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated an exemplary semiconductor structure including a bulk semiconductor substrate 10 of, from bottom to top, a silicon base layer 12 having a p-type conductivity and a first dopant concentration, and a boron doped silicon layer 14 having a second dopant concentration that is less than the first dopant concentration that can be employed in accordance with an embodiment of the present application.

As mentioned above, the bulk semiconductor substrate 10 of FIG. 1 includes a silicon base layer 12 having a p-type conductivity and a first dopant concentration. By "p-type conductivity" it is meant that the silicon base layer 12 contains a p-type dopant. The term "p-type dopant" denotes an impurity (e.g., dopant) that when added to an intrinsic semiconductor material creates deficiencies of free electrons in the intrinsic semiconductor material. For silicon, boron, aluminum, gallium and/or indium may be used a p-type impurity. Typically, boron is used in the present application as the dopant that provides the p-type conductivity to the silicon base layer 12. The first dopant concentration of the p-dopant that may be present in the silicon base layer 12 can be from $5 \times 10^{18}$ atom/cm$^3$ to $1 \times 10^{20}$ atoms/cm$^3$. The p-type dopant can be introduced into the silicon base layer 12 during the formation of the same, or alternatively the p-type dopant can be introduced into an intrinsic semiconductor material by utilizing ion implantation.

The boron doped silicon layer 14 having the second dopant concentration that is less than the first dopant concentration can be formed atop the silicon base layer 12 utilizing an epitaxial growth process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In the present application, the boron doped silicon layer 14 has an epitaxial relationship, i.e., same crystal orientation, as that of the silicon base layer 12. In the present application, the silicon base layer 12 may have any crystallographic surface orientation such as, for example, {100}, {110} or {111}.

Examples of various epitaxial growth processes that are suitable for use in forming the boron doped silicon layer 14 include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). The temperature for epitaxial deposition typically ranges from 250° C. to 900° C. Although higher temperature typically results in faster deposition, the faster deposition may result in crystal defects and film cracking.

A number of different source gases may be used for the deposition of boron doped silicon layer 14. In some embodiments, the source gas for the deposition of the boron doped silicon layer 14 includes a silicon containing gas source. Carrier gases like hydrogen, nitrogen, helium and argon can be used. In one embodiment, boron can be introduced into the source gas during the epitaxial deposition process. In another embodiment, boron can be introduced into an intrinsic silicon layer in a concentration that is sufficient to provide boron doped silicon layer 14 by utilizing ion implantation or gas phase doping.

Alternatively, it may be possible to first form a boron doped silicon material that has the second dopant concentration. Ion implantation of boron or another like p-type dopant can then be performed which forms the silicon base layer 12 of the bulk semiconductor substrate 10 shown in FIG. 1.

The thickness of the boron doped silicon layer 14 that can be formed is from 100 nm to 500 nm. Other thicknesses that are lesser than, or greater than, the aforementioned thickness range can also be employed in the present application. The second dopant concentration of the boron doped silicon layer 14 can be in a range from $1 \times 10^{18}$ atom/cm$^3$ to $5 \times 10^{18}$ atoms/cm$^3$. Other ranges for the second dopant concentration may also be employed in the present application as long as the second dopant concentration that is present in the boron doped silicon layer 14 is less than the first dopant concentration that is present in the silicon base layer 12.

Figure 2:
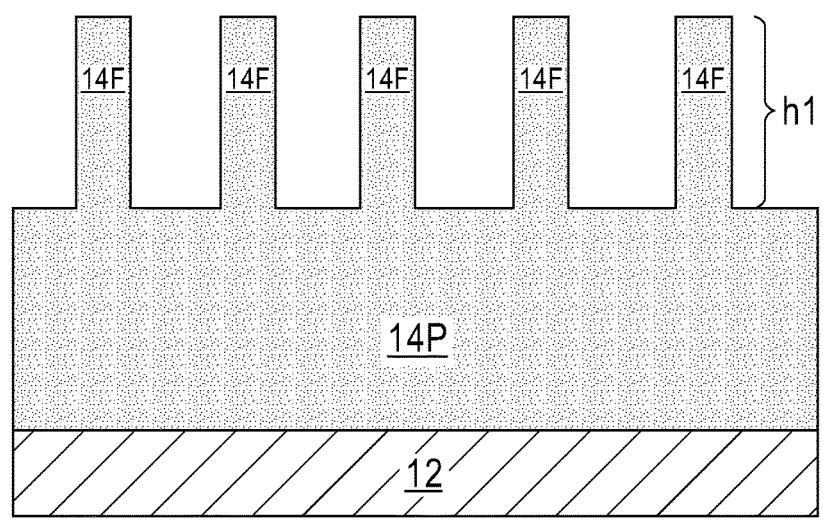
FIG. 2 is a cross sectional view of the exemplary semiconductor structure of FIG. 1 after patterning the boron doped silicon layer to form a plurality of first silicon fins of a first height extending upward from a remaining portion of the boron doped silicon layer.

Referring now to FIG. 2, there is illustrated the exemplary semiconductor structure of FIG. 1 after patterning the boron doped silicon layer 14 to form a plurality of first silicon fins 14F of a first height h1 extending upward from a remaining portion of the boron doped silicon layer; the remaining portion of the boron doped silicon layer may be referred to herein as boron doped silicon portion 14P. At this point of the present application, no material interface is present between each first silicon fin 14F and the underlying boron doped silicon portion 14P.

Each first silicon fin 14F can be formed by patterning the boron doped silicon layer 14. In one embodiment, the patterning process used to define each silicon fin of the first height 14F comprises a sidewall image transfer (SIT) process. The SIT process includes forming a contiguous mandrel material layer (not shown) on the boron doped silicon layer 14. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching. Since the dielectric spacers are used in the SIT process as an etch mask, the width of the each dielectric spacer determines the width of each first silicon fin 14F of the first height h1.

After formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into an upper portion of the boron doped silicon layer 14. The pattern transfer may be achieved by utilizing at least one etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In another embodiment, the patterning process used to define each first silicon fin 14F of the first height h1 can include lithography and etching. Lithography includes forming a photoresist material (not shown) on the boron doped silicon layer 14. The photoresist material can be formed utilizing a deposition process such as, for example, spin-on coating, evaporation, or chemical vapor deposition. Following the deposition of the photoresist material, the photoresist material is exposed to a pattern of irradiation, and thereafter the exposed resist material is developed utilizing a conventional resist developer to provide a patterned photoresist material. At least one etch as mentioned above for the SIT process can be used here to complete the pattern transfer. Following at least one pattern transfer etch process, the patterned photoresist material can be removed from the structure utilizing a conventional resist stripping process such as, for example, ashing.

As used herein, a "fin" refers to a contiguous semiconductor material, in the present case silicon, and including a pair of vertical sidewalls that are parallel to each other. As used herein, a surface is "vertical" if there exists a vertical plane from which the surface does not deviate by more than three times the root mean square roughness of the surface. The first height h1 of each first silicon fin 14F can be from 30 nm to 100 nm. The width of each first silicon fin 14F can be from 6 nm to 10 nm. Other first heights h1 and widths that are lesser than, or greater than, the ranges mentioned above can also be employed in the present application for each first silicon fin 14F.

Figure 3:
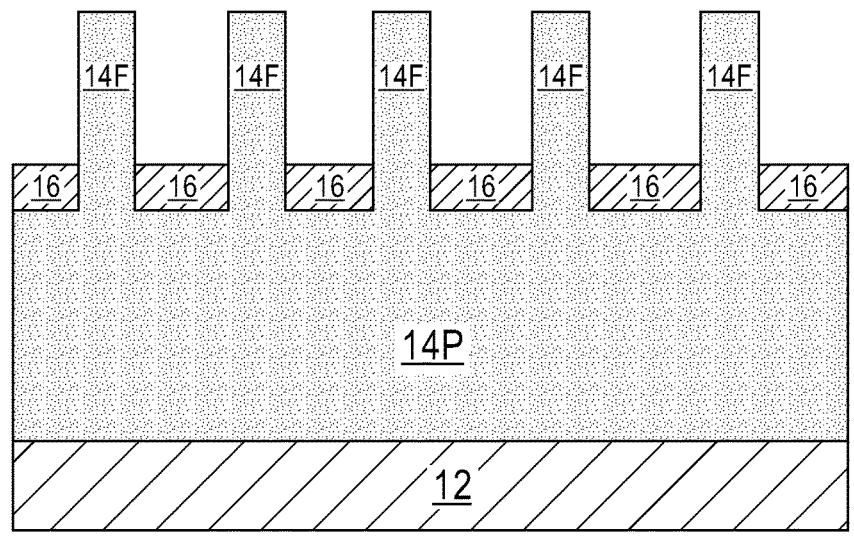
FIG. 3 is a cross sectional view of the exemplary semiconductor structure of FIG. 2 after forming a first sacrificial dielectric structure between each first silicon fin of the first height.

Referring now to FIG. 3, there is illustrated the exemplary semiconductor structure of FIG. 2 after forming a first sacrificial dielectric structure 16 between each first silicon fin 14F of the first height h1. Each first sacrificial dielectric structure 16 that is formed has a topmost surface that is located beneath a topmost surface of each first silicon fin 14F. Also, each first sacrificial dielectric structure 16 that is formed has a bottommost surface that contacts a topmost surface of boron doped silicon portion 14P.

Each first sacrificial dielectric structure 16 that is formed comprises a dielectric material such as, for example, an oxide, nitride and/or oxynitride. In one example, silicon dioxide can be used as the dielectric material that provides each first sacrificial dielectric structure 16. The dielectric material that provides each first sacrificial dielectric structure 16 can be formed by a deposition process such as, for example, chemical vapor deposition or plasma enhanced chemical vapor deposition. The deposition process may overfill the gap located between each first silicon fin 14F. In such an embodiment, a planarization process such as, for example, chemical mechanical polishing and/or grinding may be first used to reduce the height of the deposited dielectric material to a height of the first silicon fins 14F. After planarization, an etch back process can be used to form each first sacrificial dielectric structure 16. In yet another embodiment, the deposition process may partially fill each gap with a dielectric material. In some embodiments, a recess etch may, or may not, be employed to provide each first sacrificial dielectric structure 16.

Figure 4:
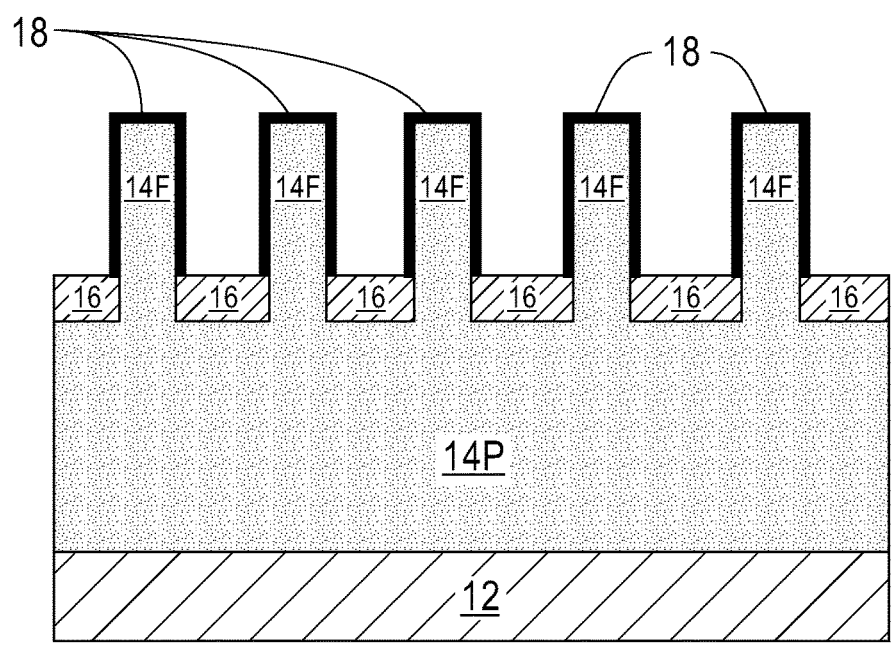
FIG. 4 is a cross sectional view of the exemplary semiconductor structure of FIG. 3 after forming a first sacrificial spacer on each first silicon fin of the first height.

Referring now to FIG. 4, there is illustrated the exemplary semiconductor structure of FIG. 3 after forming a first sacrificial spacer 18 on each first silicon fin 14F of the first height h1. As is shown, each first sacrificial spacer 18 is formed on exposed sidewall surfaces and a topmost surface of each first silicon fin 14F. A portion of each first sacrificial spacer 18 also contacts a portion of a topmost surface of each first sacrificial dielectric structure 16.

The first sacrificial spacer 18 comprises a dielectric material that differs from the dielectric material of the first sacrificial dielectric structure 16. Illustrative examples of dielectric materials that can be used in providing each first sacrificial spacer 18 may comprise an oxide, nitride and/or oxynitride. In one example, silicon nitride can be used as the dielectric material that provides each first sacrificial spacer 18. The dielectric material that provides each first sacrificial spacer 18 can be formed by a deposition process such as, for example, chemical vapor deposition or plasma enhanced chemical vapor deposition. After depositing the dielectric material that provides each first sacrificial spacer 18, an etching process can be used to form each first sacrificial spacer 18.

Figure 5:
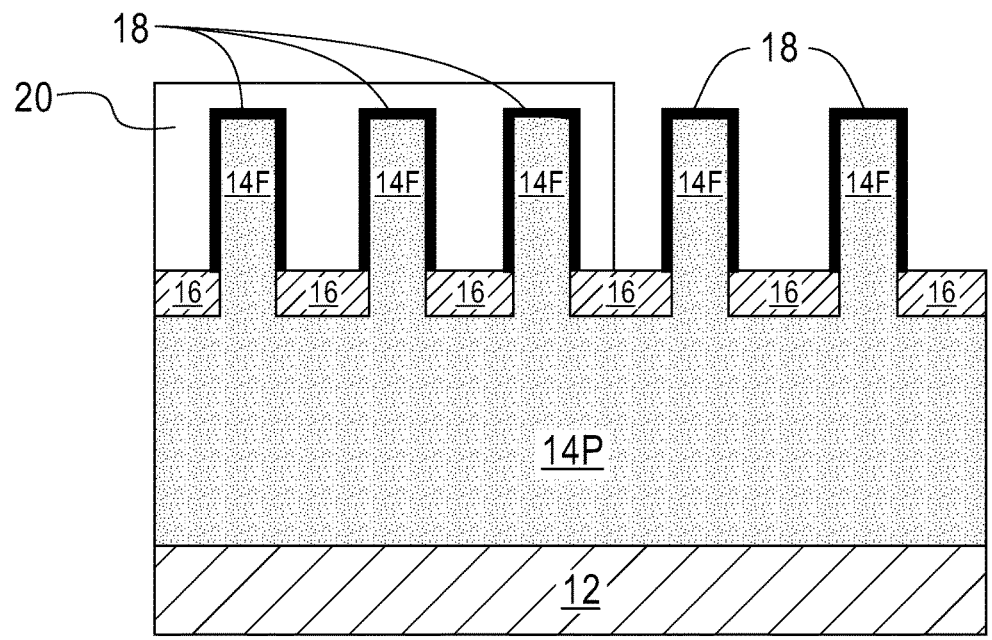
FIG. 5 is a cross sectional view of the exemplary semiconductor structure of FIG. 4 after forming a block mask protecting one set of first silicon fins of the first height, while leaving another set of the first silicon fins exposed.

Referring now to FIG. 5, there is illustrated the exemplary semiconductor structure of FIG. 4 after forming a block mask 20 protecting one set of first silicon fins 14F of the first height h1, while leaving another set of first silicon fins 14F exposed. The block mask 20 that can be employed in the present application includes any material that has a different etch rate than the first sacrificial dielectric structure 16, the first sacrificial spacer 18, and the boron doped silicon portion 14P. In one embodiment, the block mask 20 may be composed of only a photoresist material. In another embodiment, the block mask 20 may be composed of only a hard mask material. Examples of hard mask materials that can be used as block mask 20 include silicon dioxide, silicon nitride and/or silicon oxynitride. In another embodiment of the present application, the block mask 20 may comprise a stack of, from bottom to top, a hard mask material and a photoresist material.

The block mask 20 can be formed utilizing techniques that are well known to those skilled in the art. For example, the block mask 20 can be formed by first depositing at least one of the above mentioned materials and then patterning the at least one deposited material by lithography. An anisotropic etching process such as, for example, reactive ion etching can also be used to complete any pattern transfer that may be needed; for example, an anisotropic etch may be used to transfer a pattern from a lithographically defined photoresist into the underlying material that may define the block mask 20.

Figure 6:
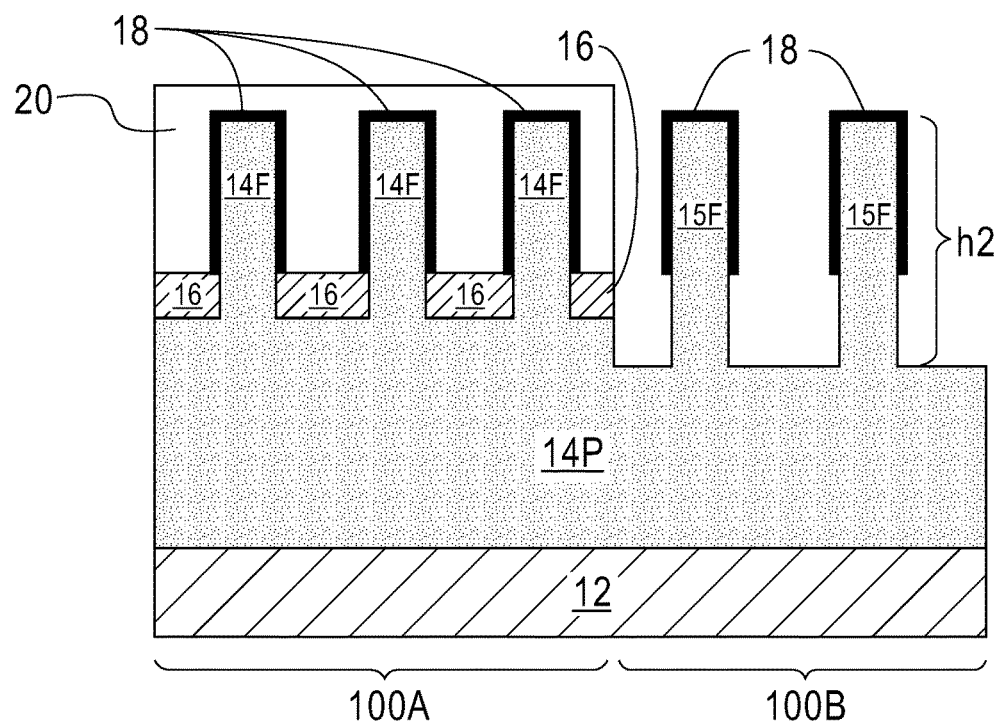
FIG. 6 is a cross sectional view of the exemplary semiconductor structure of FIG. 5 after removing each exposed sacrificial dielectric structure and an underlying portion of the remaining portion of the boron doped silicon layer not protected by the block mask to provide second silicon fins of a second height which is greater than the first height.

Referring now to FIG. 6, there is illustrated the exemplary semiconductor structure of FIG. 5 after removing each exposed sacrificial dielectric structure 16 and an underlying portion of the remaining portion of the boron doped silicon layer (i.e., an underlying portion of boron doped silicon portion 14P) to provide second silicon fins 15F of a second height h2 which is greater than the first height h1 of each first silicon fin 14F. Each first silicon fin 14F is present within a first device region 100A of the exemplary semiconductor structure of the present application, while each second silicon fin 15F is present within a second device region 100B of the exemplary semiconductor structure of the present application. Although a plurality of first silicon fins 14F and a plurality of second silicon fins 15F are described and illustrated, the present application contemplates an embodiment in which a single first silicon fin 14F can be present in the first device region 100A at this point of the present application, and/or a single second silicon fin 15F can be present in the second device region 100B at this point of the present application.

The removal of each exposed sacrificial dielectric structure 16 and the underlying portion of boron doped silicon portion 14P can performed utilizing a single etch or multiple etching steps. During this step of the present application, the boron doped silicon portion 14P in the second device region 100B is recessed. Also, during this step of the present application, the etch process converts the second set of first silicon fins 14F into second silicon fins 15F of the second height.

The etch may include an anisotropic etch such as, for example, reactive ion etching. The etch provides the second silicon fins 15F as well as providing a topmost surface of the boron doped silicon portion 14P within the second device region 100B that is located beneath a topmost surface of the boron doped silicon portion 14P within the first device region 100A. Each second silicon fin 15F constitutes the entirety of one of the first silicon fins and a non-etched (i.e., non-recessed) portion of the boron doped silicon portion 14P.

The second height h2 of each second silicon fin 15F can be from 50 nm to 200 nm. The width of each second silicon fin 15F is the same as the width mentioned above for each first silicon fin 14F. Other second heights h2 that are lesser than, or greater than, the ranges mentioned above can also be employed in the present application for each second silicon fin 15F.

Figure 7:
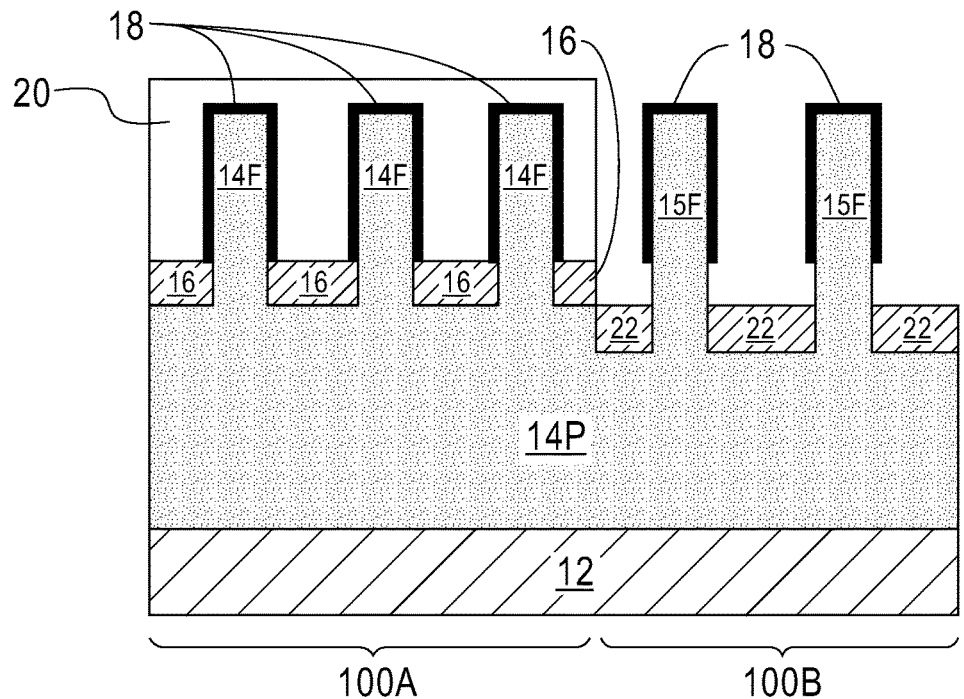
FIG. 7 is a cross sectional view of the exemplary semiconductor structure of FIG. 6 after forming a second sacrificial dielectric structure between each second silicon fin of the second height.

Referring now to FIG. 7, there is illustrated the exemplary semiconductor structure of FIG. 6 after forming a second sacrificial dielectric structure 22 between each second silicon fin 15F of the second height h2. Each second sacrificial dielectric structure 22 that is formed has a topmost surface that is located beneath a topmost surface of each second silicon fin 15F. Also, each second sacrificial dielectric structure 22 that is formed has a bottommost surface that contacts a recessed surface of boron doped silicon portion 14P in the second device region 100B. As is shown, the topmost surface of each second sacrificial dielectric structure 22 is vertically offset from the topmost surface of each first sacrificial dielectric structure 16. As such, a lower portion of each second silicon fin 15F remains exposed at this point of the present application.

Each second sacrificial dielectric structure 22 that is formed comprises one of the dielectric materials mentioned above for the providing each first sacrificial dielectric structure 16. In one embodiment of the present application, the dielectric material that provides each second sacrificial dielectric structure 22 is the same as the dielectric material that provides each first sacrificial dielectric structure 16. In one example, silicon dioxide is used as the dielectric material of each second sacrificial dielectric structure 22 and each first sacrificial dielectric structure 16. In another embodiment, the dielectric material that provides each second sacrificial dielectric structure 22 is different from the dielectric material that provides each first sacrificial dielectric structure 16. In one example, silicon dioxide can be used for the providing each first sacrificial dielectric structure 16, while silicon oxynitride can be used in providing each second sacrificial dielectric structure 22. Each second sacrificial dielectric structure 22 can be formed utilizing the processing steps mentioned above in forming each first sacrificial dielectric structure 16.

Figure 8:
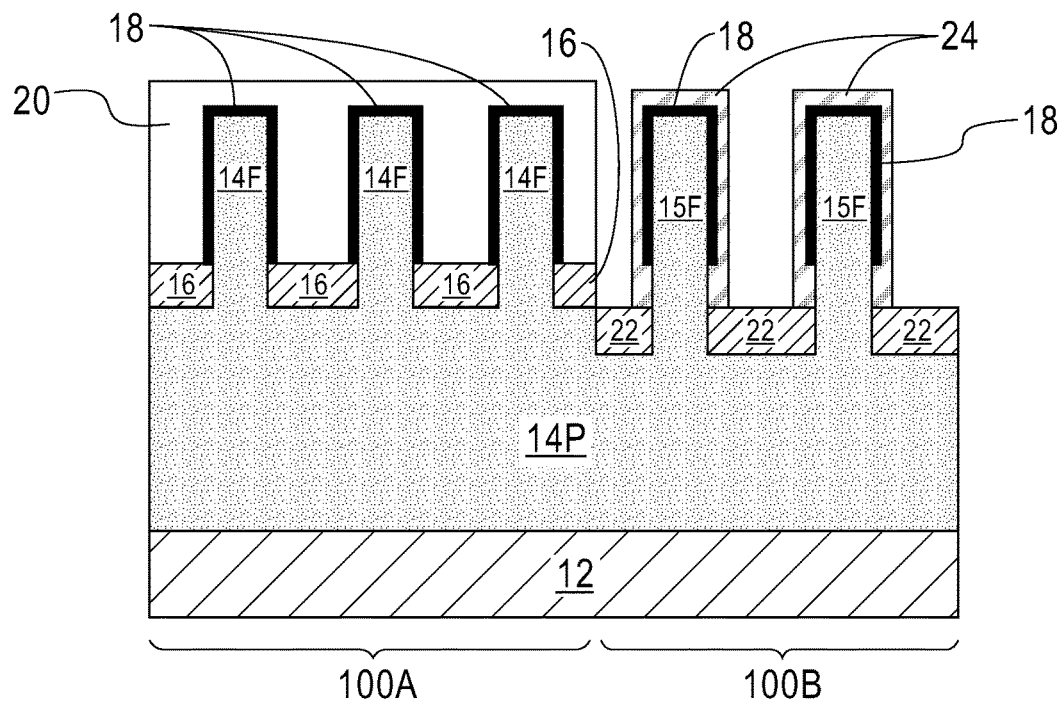
FIG. 8 is a cross sectional view of the exemplary semiconductor structure of FIG. 7 after forming a second sacrificial spacer surrounding each second silicon fin of the second height.

Referring now to FIG. 8, there is illustrated the exemplary semiconductor structure of FIG. 7 after forming a second sacrificial spacer 24 surrounding each second silicon fin 15F of the second height h2. As is shown in FIG. 8, a first portion of each second sacrificial spacer 24 is located on an outermost surface of each first sacrificial spacer 18 that is present on each second silicon fin 15F, a second portion of each second sacrificial spacer 24 is located on an exposed sidewall surface of each second silicon fin 15F, and a third portion of each second sacrificial spacer 24 is located on a portion of a topmost surface of each second sacrificial dielectric structure 22.

Each second sacrificial spacer 24 comprises one of the dielectric materials mentioned above for the first sacrificial spacer 18. In one embodiment of the present application, the dielectric material that provides each second sacrificial spacer 24 is the same as the dielectric material that provides each first sacrificial spacer 18. In another embodiment of the present application, the dielectric material that provides each second sacrificial spacer 24 is different from the dielectric material that provides each first sacrificial spacer 18. Each second sacrificial spacer 24 can be formed utilizing the technique as described above in providing each first sacrificial spacer 18.

Figure 9:
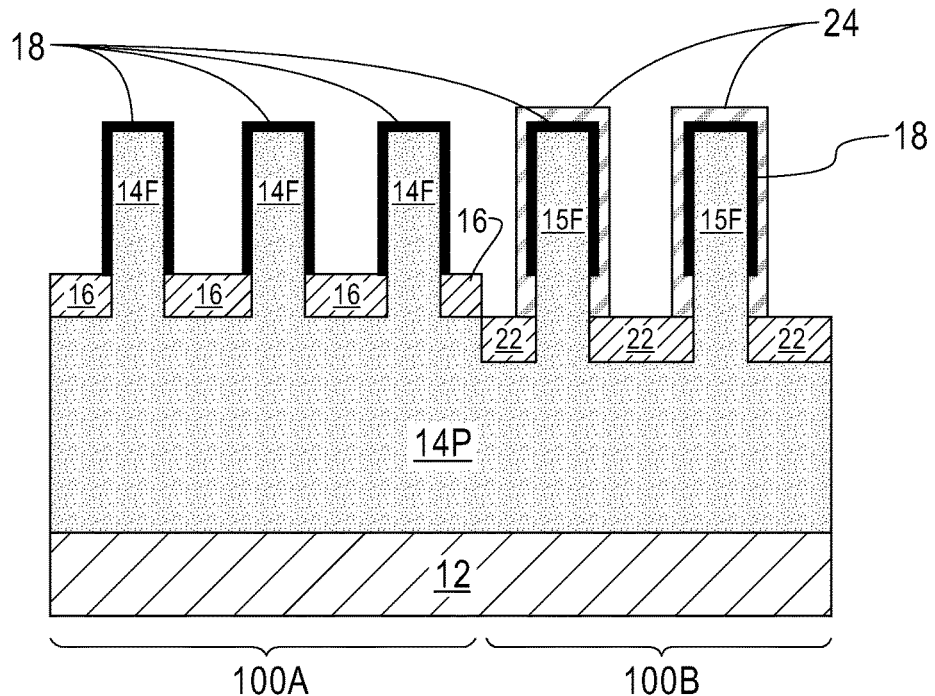
FIG. 9 is a cross sectional view of the exemplary semiconductor structure of FIG. 8 after removing the block mask.

Referring now to FIG. 9, there is illustrated the exemplary semiconductor structure of FIG. 8 after removing the block mask 20. The removal of the block mask uncovers the first device region 100A. The block mask 20 can be removed utilizing any conventional process that can selectively remove the material or materials that provide the block mask 20. In one embodiment, and when the block mask is composed of a remaining portion of a photoresist material, the remaining portion of the photoresist material can be removed utilizing a resist stripping process such as, for example, ashing. In another embodiment, and when the block mask 20 is composed of hard mask material, a planarization process such as, for example, chemical mechanical polishing (CMP) or grinding may be used. Alternatively, an etching process can be used to selectively remove the hard mask material. When the hard mask 20 is comprised of a stack of, from bottom to top, a hard mask material and a photoresist material, the photoresist material can be removed first by utilizing a resist stripping process, and thereafter a planarization process or etching may be used to remove the hard mask material.

Figure 10:
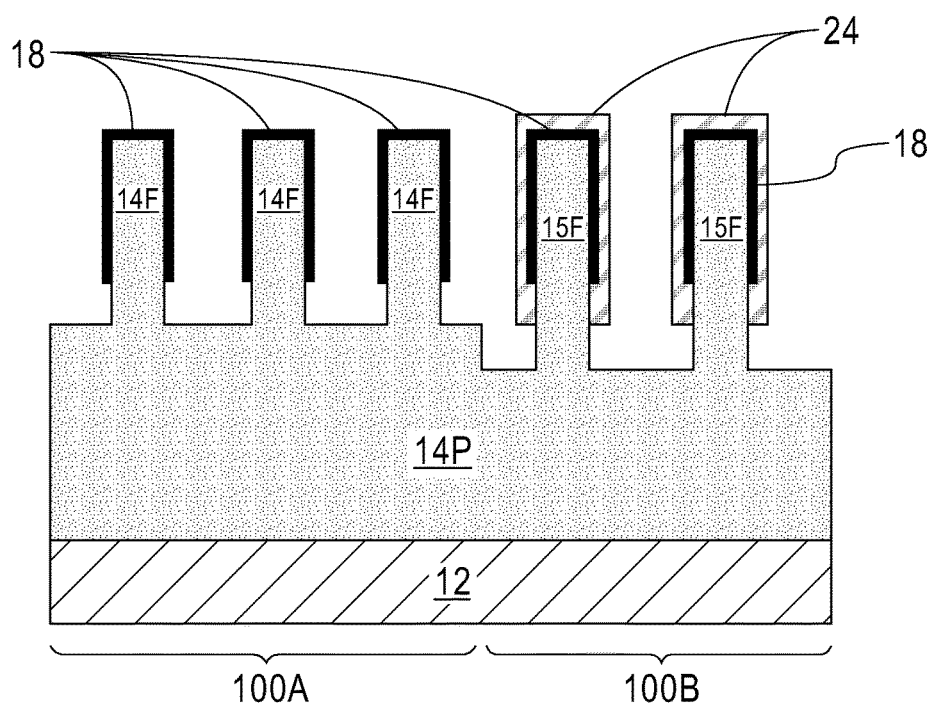
FIG. 10 is a cross sectional view of the exemplary semiconductor structure of FIG. 9 after removing each first sacrificial dielectric structure from between each first silicon fin of the first height and each second sacrificial dielectric structure between each second silicon fin of the second height.

Referring now to FIG. 10, there is illustrated the exemplary semiconductor structure of FIG. 9 after removing each first sacrificial dielectric structure 16 from between each first silicon fin 14F of the first height h1 and each second sacrificial dielectric structure 22 between each second silicon fin 15F of the second height h2. In one embodiment and when each first sacrificial dielectric structure 16 and each second sacrificial dielectric structure 22 comprise a same dielectric material, a single etch can be used to removed each first sacrificial dielectric structure 16 and each second sacrificial dielectric structure 22. In one example, and when each first sacrificial dielectric structure 16 and each second sacrificial dielectric structure 22 comprises silicon dioxide, an aqueous hydrofluoric acid etch can be used. In another embodiment of the present application and when each first sacrificial dielectric structure 16 comprises a different dielectric material than each second sacrificial dielectric structure 22, a combination of two different etching process may be employed.

The removal of each first sacrificial dielectric structure 16 exposes a topmost surface of the boron doped silicon portion 14P in the first device region 100A as well as a bottom portion of each first silicon fin 14F. The removal of each second sacrificial dielectric structure 22 exposes a topmost surface of the boron doped silicon portion 14P in the second device region 100B as well as a bottom portion of each second silicon fin 14F. As is shown in FIG. 10, the topmost surface of the boron doped silicon portion 14P in the first device region 100A is located above the topmost surface of the boron doped silicon portion 14P in the second device region 100B.

Figure 11:
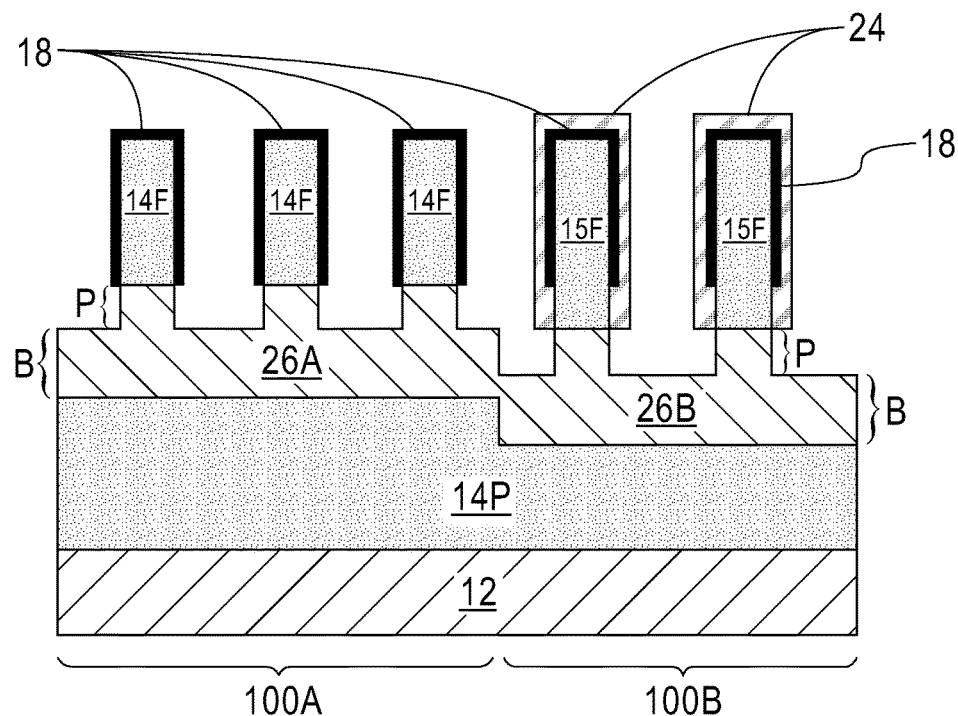
FIG. 11 is a cross sectional view of the exemplary semiconductor structure of FIG. 10 after forming a first boron doped region of a third dopant concentration in an upper remaining portion of the boron doped silicon layer and directly beneath each first silicon fin of the first height and a second boron doped region of the third dopant concentration in an upper remaining portion of the boron doped silicon layer and directly beneath each second silicon fin of the second height, wherein the third dopant concentration is greater than the second dopant concentration.

Referring now to FIG. 11, there is illustrated the exemplary semiconductor structure of FIG. 10 after forming a first boron doped region 26A of a third dopant concentration in an upper remaining portion of the boron doped silicon layer (i.e., boron doped silicon portion 14P) and directly beneath each first silicon fin 14F of the first height h1 and a second boron doped region 26B of the third dopant concentration in an upper remaining portion of the boron doped silicon layer 14P and directly beneath each second silicon fin 15F of the second height h2, wherein the third dopant concentration is greater than the second dopant concentration. Notably, a portion of the first boron doped region 26A forms in the exposed bottom portion of each first silicon fin 14F. Also, a portion of the second boron doped region 26B forms in the exposed bottom portion of each second silicon fin 15F.

The first boron doped region 26A and the second boron doped region 26B are interconnect and are formed simultaneously by implanting boron into the exposed bottom portion of each first silicon fin 14F and each second silicon fin 15F as well as an upper portion of the boron doped silicon portion 14P that is present beneath each of the silicon fins (14F, 15F). The implanting of boron can be performed utilizing conditions that are well known in the art. In one example, the following boron implantation conditions can be used in the present application in forming the first and second boron doped regions (26A, 26B): $BF_2$ can be used as the boron dopant source and the energy that is employed is dependent on the desired thickness of the first and second boron doped regions (26A, 26B). The first boron doped region 26A and the second boron doped region 26B both include silicon and boron.

As mentioned above, each of the first boron doped region 26A and the second boron doped region 26B has a third dopant concentration that is greater than the second dopant concentration in the boron doped silicon portion 14P. In one embodiment of the present application, the third dopant concentration that is present in the first boron doped region 26A and the second boron doped region 26B is from $1\times10^{20}$ atom/cm$^3$ to $3\times10^{20}$ atoms/cm$^3$. Other ranges for the third dopant concentration may also be employed in the present application as long as the third dopant concentration that is present in the first boron doped region 26A and the second boron doped region 26B is greater than the second dopant concentration that is present in the boron doped silicon layer 14; the third dopant concentration is also less than the first dopant concentration of the silicon base layer 12.

Each of the first boron doped region 26A and the second boron doped region 26B has a pedestal portion, P, and an underlying base portion, B. The base portion, B, of each of the boron doped regions (26A, 26B) has a width that is greater than a width of the pedestal portion, P. The pedestal portion, P, of the first boron doped region 26A has sidewall surfaces that are vertically coincident to sidewall surfaces of an overlying first silicon fin 14F. The pedestal portion, P, of the second boron doped region 26B has sidewall surfaces that are vertically coincident to sidewall surfaces of an overlying second silicon fin 15F. As is shown, the bottommost surface of each first silicon fin 14F is present on a topmost surface of a pedestal portion, P, of the underlying first boron doped region 26A, and the bottommost surface of each second silicon fin 15F is present on a topmost surface of the pedestal portion, P, of the underlying second boron doped region 26B. As is illustrated, the pedestal portion, P, of the first boron doped region 26A has a topmost surface that is located above a topmost surface of the pedestal portion, P, of the second boron doped region 26B.

The boron doped silicon portion 14P that is located in the first device region 100A has a topmost surface that is located above a topmost surface of the boron doped silicon portion 14P in the second device region 100B. The silicon base layer 12 that is located directly beneath the boron doped silicon portion 14P has an entirely planar topmost surface (i.e., it has a same height or thickness in both device regions.

Figure 12:
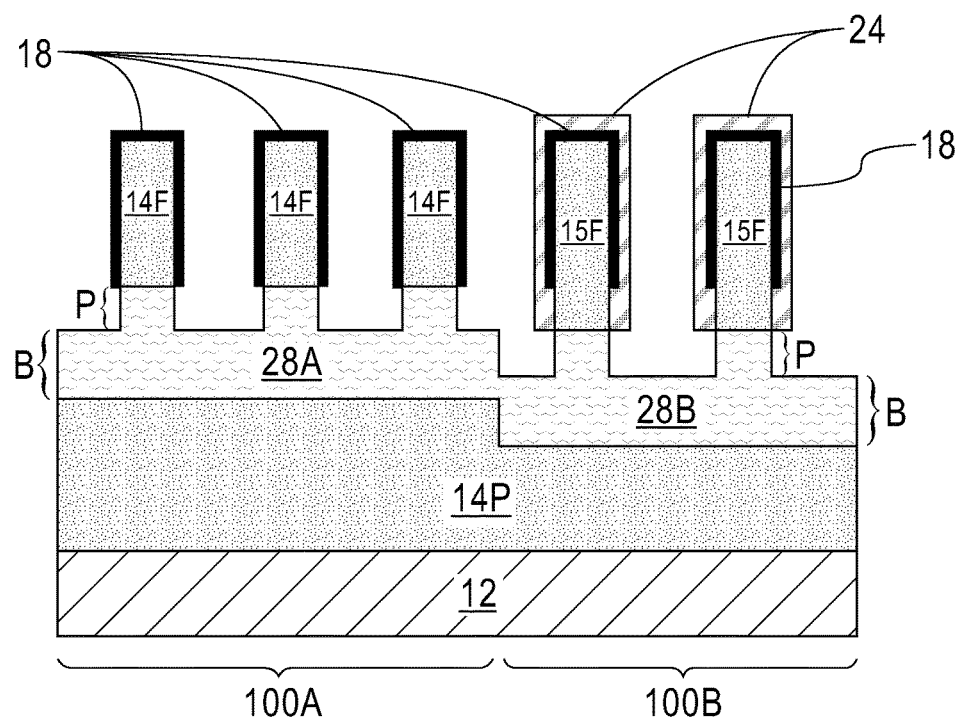
FIG. 12 is a cross sectional view of the exemplary semiconductor structure of FIG. 11 after converting each boron doped region of the third dopant concentration into a porous silicon region.

Referring now to FIG. 12, there is illustrated the exemplary semiconductor structure of FIG. 11 after converting each boron doped region (26A, 26B) of the third dopant concentration into a porous silicon region (28A, 28B). Element 28A represents a first porous silicon region that is present in the first device region 100A and is located directly beneath each first silicon fin 14F, while element 28B represents a second porous silicon region that is present in the second device region 100B and is located directly beneath each second silicon fin 15F. The term "porous silicon" as used throughout the present application denotes silicon in which nanoporous holes have been introduced into its microstructure, rendering a large surface to volume ratio which may be in the order of 500 m$^2$/cm$^3$. The first porous silicon region 28A is interconnected to the second porous silicon region 28B.

The converting of each boron doped region (26A, 26B) into a porous silicon region (28A, 28B) is carried in the present application utilizing an anodization process. The anodization process is performed by immersing the structure shown in FIG. 11 into a HF-containing solution while an electrical bias is applied to the structure with respect to an electrode (typically a negative electrode) also placed in the HF-containing solution. In such a process, the silicon base layer 12 typically serves as the positive electrode of the electrochemical cell, while a metal such as platinum is employed as the negative electrode. The rate of formation and the nature of the porous silicon region (28A, 28B) so-formed (porosity and microstructure) is determined by both the material properties, i.e., doping type and concentration, as well as the reaction conditions of the anodization process itself (current density, bias, illumination and additives in the HF-containing solution). Generally, each porous silicon region (26A, 26B) that is provided in the present application has a porosity of about 0.1% or higher.

The term "HF-containing solution" includes concentrated HF (49%), a mixture of HF and water, a mixture of HF and a monohydric alcohol such as methanol, ethanol, propanol, etc, or HF mixed with at least one surfactant. The amount of surfactant that is present in the HF-containing solution is typically from about 1 to about 50%, based on 49% HF.

The anodization process of the present application can be performed using a constant current source that operates at a current density from 0.05 milliAmps/cm$^2$ to 50 milliAmps/cm$^2$. A light source may be optionally used to illuminate the sample. The anodization process is typically performed at room temperature (from 20° C. to 30° C.) or, a temperature that is elevated from room temperature may be used. In one example, the elevate temperature may be from 30° C. up to 100° C.

Following the anodization process, the exemplary semiconductor structure shown in FIG. 12 is typically rinsed with deionized water and dried. Anodization typically occurs for a time period of less than 10 minutes, with a time period of less than 1 minute being more typical.

Each of the first porous silicon region 28A and the second porous silicon region 28B has a pedestal portion, P, and an underlying base portion, B. The base portion, B, of each of the porous silicon regions (28A, 28B) has a width that is greater than a width of the pedestal portion, P. The pedestal portion, P, of the first porous silicon region 28A has sidewall surfaces that are vertically coincident to sidewall surfaces of an overlying first silicon fin 14F. The pedestal portion, P, of the second porous silicon region 28B has sidewall surfaces that are vertically coincident to sidewall surfaces of an overlying second silicon fin 15F. As is shown, the bottommost surface of each first silicon fin 14F is present on a topmost surface of a pedestal portion, P, of the underlying first porous silicon region 28A, and the bottommost surface of each second silicon fin 15F is present on a topmost surface of the pedestal portion, P of the underlying second porous silicon region 28B. As is illustrated, the pedestal portion, P, of the first porous silicon region 28A has a topmost surface that is located above a topmost surface of the pedestal portion, P, of the second porous silicon region 28B.

As shown in FIG. 12, the boron doped silicon portion 14P that is located in the first device region 100A has a topmost surface that is located above a topmost surface of the boron doped silicon portion 14P in the second device region 100B. The silicon base layer 12 that is located directly beneath the boron doped silicon portion 14P has an entirely planar topmost surface (i.e., it has a same height or thickness in both device regions.

Figure 13:
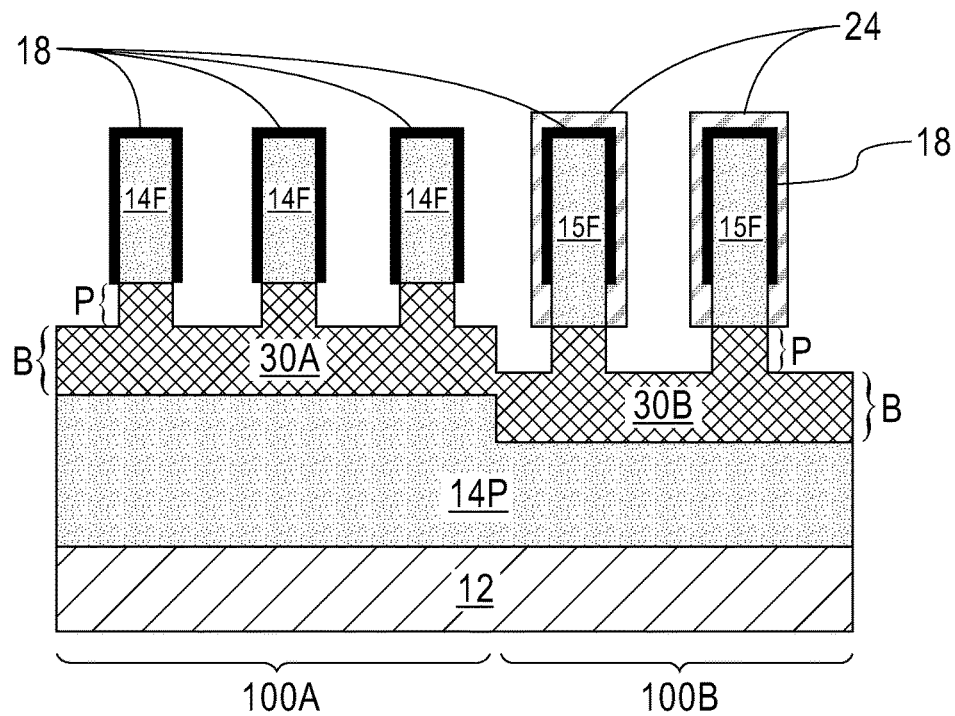
FIG. 13 is a cross sectional view of the exemplary semiconductor structure of FIG. 12 after converting each porous silicon region into an oxide structure.

Referring now to FIG. 13, there is illustrated the exemplary semiconductor structure of FIG. 12 after converting each porous silicon region (28A, 28B) into an oxide structure (30A, 30B). Element 30A represents a first oxide structure that is present in the first device region 100A and is located directly beneath each first silicon fin 14F, while element 30B represents a second oxide structure that is present in the second device region 100B and is located directly beneath each second silicon fin 15F.

Each porous silicon region (28A, 28B) is converted into an oxide structure (30A, 30B) utilizing an oxidation anneal. In the present application, each porous silicon region (28A, 28B) serves as an oxygen sponge thus oxidation occurs within the porous silicon regions 28A, 28B. The oxidation anneal that can be employed in the present application can be performed in an oxidizing ambient such as, for example, oxygen, air, ozone, water vapor, and/or $NO_2$. In some embodiments, the oxidizing ambient can be admixed with an inert gas such as, for example, He, Ar and/or Ne. In such an embodiment, the inert gas constituent from 2 volume % to 95 volume % of an oxidizing ambient containing admixture. The oxidation anneal can be performed at a temperature from 400° C. to 1100° C. The oxidation anneal may include a furnace anneal, a rapid thermal anneal or any other anneal that can convert the first porous silicon region 28A into the first oxide structure 30A and the second porous silicon region 28B into the second oxide structure 30B.

Figure 14:
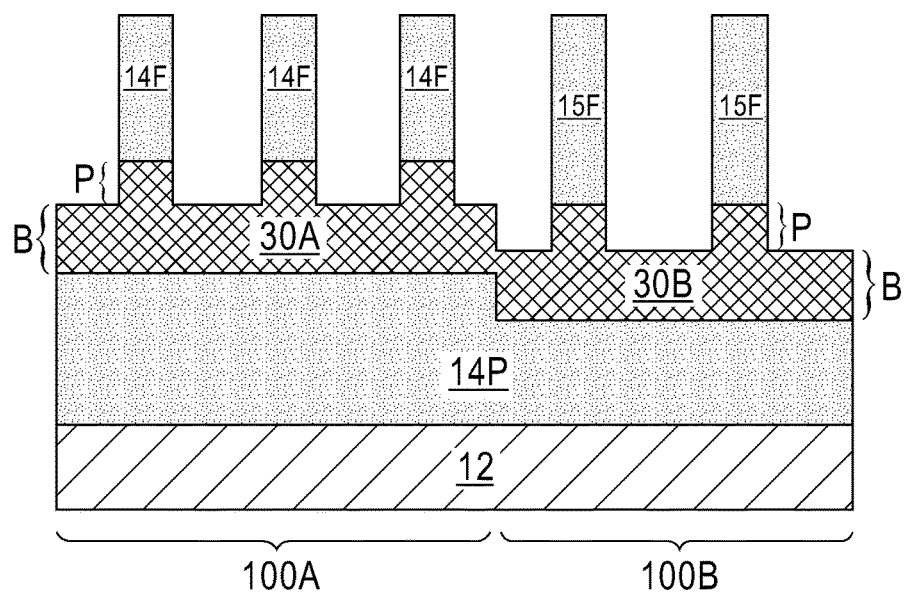
FIG. 14 is a cross sectional view of the exemplary semiconductor structure of FIG. 13 after removing each second sacrificial spacer and each first sacrificial spacer.

Each of the first oxide structure 30A and the second oxide structure 30B has a pedestal portion, P, and an underlying base portion, B. The base portion, B, of each of the oxide structures (30A, 30B) has a width that is greater than a width of the pedestal portion, P. The pedestal portion, P, of the first oxide structure 30A has sidewall surfaces that are vertically coincident to sidewall surfaces of an overlying first silicon fin 14F. The pedestal portion, P, of the second oxide structure 30B has sidewall surfaces that are vertically coincident to sidewall surfaces of an overlying second silicon fin 15F. As is shown, the bottommost surface of each first silicon fin 14F is present on a topmost surface of a pedestal portion, P, of the underlying first oxide structure 30A, and the bottommost surface of each second silicon fin 15F is present on a topmost surface of the pedestal portion, P, of the underlying second oxide structure 30B. As is illustrated, the pedestal portion, P, of the first oxide structure 30A has a topmost surface that is located above a topmost surface of the pedestal portion, P, of the second oxide structure 30B. As is further illustrated, the bottommost surface of the second oxide structure 30B is located beneath a bottommost surface of the first oxide structure 30A. It is noted that first oxide structure 30A and the second oxide structure 30B are interconnected with each other as shown in FIGS. 13-14. As such, the first oxide structure 30A and the second oxide structure 30B are elements of a contiguous oxide structure that is formed by converting porous silicon into an oxide structure.

As is shown in FIG. 13, the boron doped silicon portion 14P that is located in the first device region 100A has a topmost surface that is located above a topmost surface of the boron doped silicon portion 14P in the second device region 100B. The silicon base layer 12 that is located directly beneath the boron doped silicon portion 14P has an entirely planar topmost surface (i.e., it has a same height or thickness in both device regions.

Referring now to FIG. 14, there is illustrated the exemplary semiconductor structure of FIG. 13 after removing each second sacrificial spacer 24 and each first sacrificial spacer 18. The removal of each second sacrificial spacer 24 and each first sacrificial spacer 18 exposes sidewall surfaces and a topmost surface of each first silicon fin 14F and each second silicon fin 15F. The removal of each second sacrificial spacer 24 and each first sacrificial spacer 18 can be performed utilizing at least one etching process that is selective in removing the material of each second sacrificial spacer 24 and each first sacrificial spacer 18. In one embodiment of the present application, a single etch can be used (typically the case when each second sacrificial spacer 24 and each first sacrificial spacer 18 comprise a same dielectric material). In another embodiment, multiple etching process can be used to remove each second sacrificial spacer 24 and each first sacrificial spacer 18 (typically the case when the dielectric material of each second sacrificial spacer 24 differs from the dielectric material of each first sacrificial spacer 18).

Figure 15:
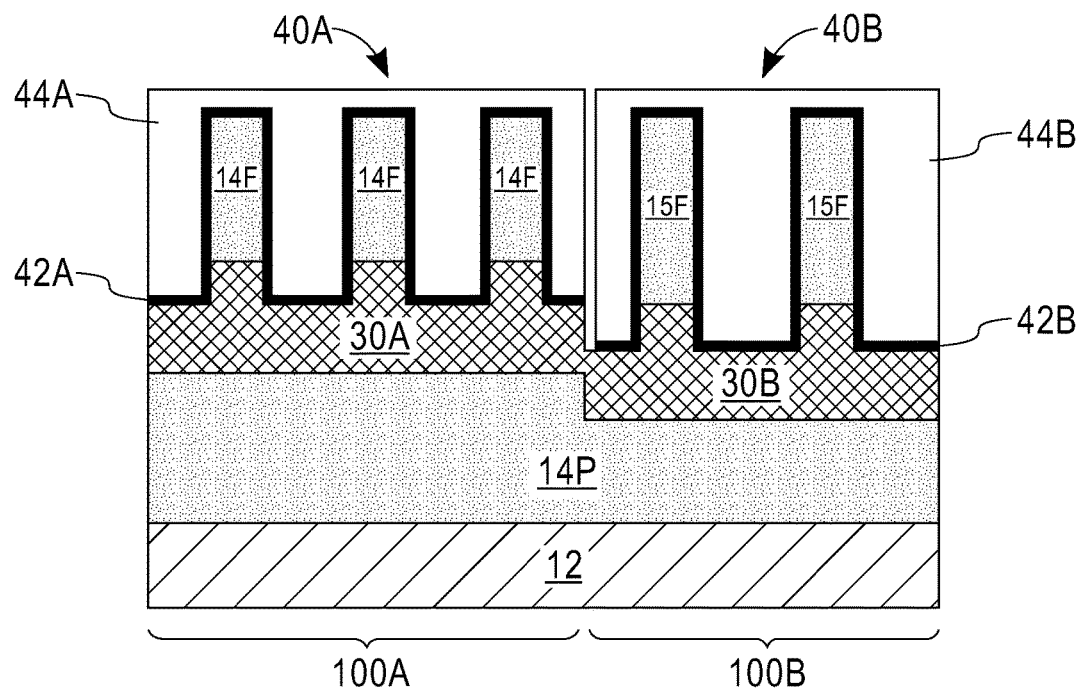
FIG. 15 is a cross sectional view of the exemplary semiconductor structure of FIG. 14 after forming a first functional gate structure straddling the set of first silicon fins of the first height, and a second functional gate structure straddling the set of second silicon fins of the second height.

Referring now to FIG. 15, there is illustrated the exemplary semiconductor structure of FIG. 14 after forming a first functional gate structure 40A straddling the set of first silicon fins 14F of the first height h1, and a second functional gate structure 40B straddling the set of second silicon fins 15F of the second height h2.

Although the present application describes and illustrates the formation of a single first functional gate structure 40A and a single second functional gate structure 40B, a plurality of first and/or second gate structures (40A, 40B) can be formed. The term "straddling" denotes that each functional gate structure (40A, 40B) is formed across a silicon fin (14F, 15F) such that a first portion of each functional gate structure (40A, 40B) is present on one side of the silicon fin (14F, 15F), and a second portion of each functional gate structure (40A, 40B) is present on another side of the silicon fin (14F, 15F).

As shown in FIG. 15, a portion of the first functional gate structure 40A is located on a topmost surface of oxide structure 30A, and a portion of the second functional gate structure 40B is located on a topmost surface of oxide structure 30B. As further shown in FIG. 15, a topmost surface of the first functional gate structure 40A is coplanar with a topmost surface of the second functional gate structure 40B, and the first and second functional gate structures (40A, 40B) are spaced apart from each other.

By "functional gate structure" it is meant a permanent gate structure used to control output current (i.e., flow of carriers in the channel) of a semiconducting device through electrical or magnetic fields. Each functional gate structure (40A, 40B) that is formed includes a gate material stack of, from bottom to top, a gate dielectric portion (42A, 42B) and a gate conductor portion (44A, 44B). In some embodiments, a gate cap portion (not shown) can be present atop the gate conductor portion (44A, 44B). In this embodiment of the present application, the gate dielectric portion (42A, 42B) contacts at least one sidewall surface of the pedestal portion, P, of the oxide structures (30A, 30B).

The gate dielectric portion (42A, 42B) comprises a gate dielectric material. The gate dielectric material that provides the gate dielectric portion (42A, 42B) can be an oxide, nitride, and/or oxynitride. In one example, the gate dielectric material that provides the gate dielectric portion (42A, 42B) can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric can be formed and used as the gate dielectric portion (42A, 42B).

The gate dielectric material used in providing the gate dielectric portion (42A, 42B) can be formed by any deposition process including, for example, chemical vapor deposition (CVD), plasma enhanced chemical vapor deposition (PECVD), physical vapor deposition (PVD), sputtering, or atomic layer deposition. In some embodiments, gate dielectric portion 42A comprises a same gate dielectric material as gate dielectric portion 42B. In other embodiments, gate dielectric portion 42A may comprise a first gate dielectric material, while gate dielectric portion 42B may comprise a second gate dielectric material that differs in composition from the first gate dielectric material. When a different gate dielectric material is used for the gate dielectric portions, block mask technology can be used. In one embodiment of the present application, the gate dielectric material used in providing the gate dielectric portion (42A, 42B) can have a thickness in a range from 1 nm to 10 nm. Other thicknesses that are lesser than, or greater than, the aforementioned thickness range can also be employed for the gate dielectric material.

The gate conductor portion (44A, 44B) comprises a gate conductor material. The gate conductor material used in providing the gate conductor portion (44A, 44B) can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. Gate conductor portion 42A may comprise a same gate conductor material as, or a different gate conductor material from gate conductor portion 42B. In some embodiments, gate conductor portion 44A may comprise an nFET gate metal, while gate conductor portion 44B may comprise a pFET gate metal. In other embodiments, gate conductor portion 44A may comprise a pFET gate metal, while gate conductor portion 44B may comprise an nFET gate metal.

The gate conductor material used in providing the gate conductor portion (44A, 44B) can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions (44A, 44B), block mask technology can be used. In one embodiment, the gate conductor material used in providing the gate conductor portion (44A, 44B) has a thickness from 1 nm to 100 nm. Other thicknesses that are lesser than, or greater than, the aforementioned thickness range can also be employed for the gate conductor material used in providing the gate conductor portion (44A, 44B).

If present, the gate cap portion comprises a gate cap material. The gate cap material that provides each gate cap portion may include one of the dielectric materials mentioned above for hard mask material. In one embodiment, each gate cap portion comprises silicon dioxide, silicon nitride, and/or silicon oxynitride. The dielectric material that provides each gate cap portion can be formed utilizing a conventional deposition process such as, for example, chemical vapor deposition or plasma enhanced chemical vapor deposition. The dielectric material that provides each gate cap portion can have a thickness from 5 nm to 20 nm. Other thicknesses that are lesser than, or greater than, the aforementioned thickness range can also be employed as the thickness of the dielectric material that provides each gate cap portion.

Each functional gate structure (40A, 40B) can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching.

In other embodiments of the present application, first and second sacrificial gate structures are first provided instead of the first and second functional gate structures (40A, 40B). In another embodiment, at least one functional gate structure can be first provided straddling one of the sets of silicon fins (14F, 15F), and at least one sacrificial gate structure can formed straddling another of the sets of the silicon fins (14F, 15F).

By sacrificial gate structure" it is meant a material or material stack that serves as a placeholder for a subsequently formed functional gate structure. In such a process, the functional gate structure is formed after the source/drain structures have been formed. In such an embodiment, the gate dielectric portion of the functional gate structure may be U-shaped. By "U-shaped" it is meant a material that includes a bottom horizontal surface and a sidewall surface that extends upward from the bottom horizontal surface. When employed, the sacrificial gate structure may include a sacrificial gate dielectric portion, a sacrificial gate material portion and a sacrificial gate cap portion. In some embodiments, the sacrificial gate dielectric portion and/or sacrificial gate cap portion may be omitted. The sacrificial gate dielectric portion includes one of the dielectric materials mentioned above for the gate dielectric portion (42A, 42B). The sacrificial gate material portion includes one of the gate conductor materials mentioned above for gate conductor portion (44A, 44B). The sacrificial gate cap portion includes one of the gate cap material mentioned above for gate cap portions. The sacrificial gate structures can be formed by deposition of the various material layers and then patterning the resultant sacrificial material sack by utilizing, for example, lithography and etching.

After forming the gate structure (functional and/or sacrificial gate structure) source/drain regions (not shown) can be formed utilizing an epitaxial growth process from exposed portions of each silicon fin (14F, 15F) that are not protected by the gate structure; the source/drain regions would by located within a plane that runs into and out of the drawing illustrated in FIG. 15. The source/drain regions comprise any semiconductor material including, for example, Si, Ge or silicon germanium alloys. The semiconductor material that provides the source/drain regions is doped with an n-type dopant or a p-type dopant as are well known those skilled in the art. The doping may be achieved during the epitaxial growth of the semiconductor material that provides the source/drain regions or after epitaxial growth of an intrinsic semiconductor material by utilizing ion implantation or gas phase doping.

In some embodiments, and prior to formation of the source/drain regions, a gate spacer (also not shown) can be formed on exposed sidewalls of the gate structure (functional gate structure and/or sacrificial gate structure). The gate spacer can be formed by deposition of a gate spacer material, such as, for example, a dielectric oxide, and then etching the deposited gate spacer material by utilizing a spacer etch.

Figure 16:
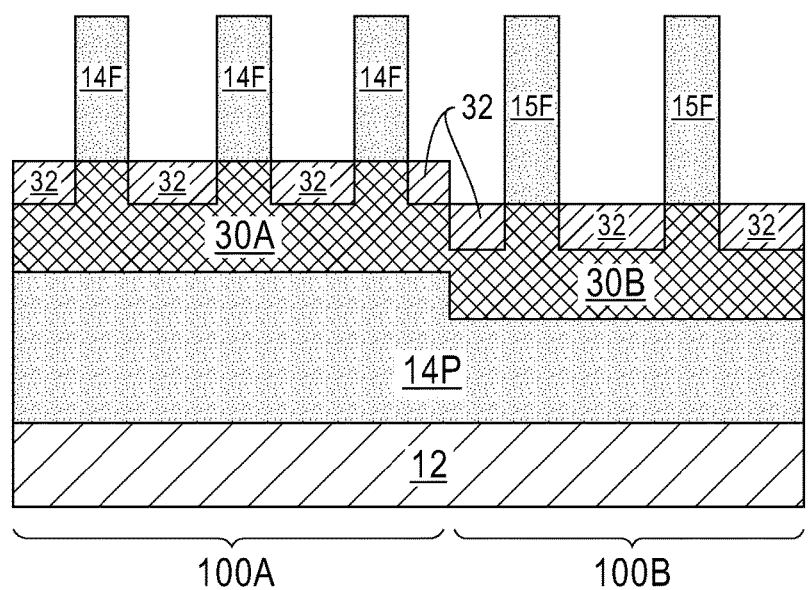
FIG. 16 is a cross sectional view of the exemplary semiconductor structure of FIG. 14 after forming an isolation structure between each first silicon fin of the first height and each second silicon fin of the second height in accordance with an alternative embodiment of the present application.

Referring now to FIG. 16, there is illustrated the exemplary semiconductor structure of FIG. 14 after forming an isolation structure 32 between each first silicon fin 14F of the first height h1 and each second silicon fin 15F of the second height h2 in accordance with an alternative embodiment of the present application. Each isolation structure 32 has at least one sidewall surface that contacts a pedestal portion of one of the oxide structures (30A, 30B). Each isolation structure 32 that is formed comprises a trench dielectric material such as, for example, an oxide or nitride. The trench dielectric material that provides each isolation region may, or may not, be the same as the material of the oxide structures (30A, 30B). In one example, silicon dioxide can be used as the trench dielectric material; in such an embodiment the isolation structure 32 comprise a same material as each oxide structure (30A, 30B). The trench dielectric material can be formed by a deposition process including, for example, chemical vapor deposition or plasma enhanced chemical vapor deposition. The deposition process may overfill each gap located between each silicon fin (14F, 15F) with the trench dielectric material. In such an embodiment, a planarization process such as, for example, chemical mechanical polishing and/or grinding may be first used to reduce the height of the deposited trench dielectric material to a height of the remaining topmost first and second silicon fins (14F, 15F). After planarization, an etch back process can be used to form each isolation structure 32. In yet another embodiment, the deposition process may partially fill each gap with a trench dielectric material. In some embodiments, a recess etch may, or may not, be employed to provide each isolation structure 32. The structure shown in FIG. 16 may be processed to include a functional gate structure in each of device region (100A, 100B). In this embodiment of the present application, the gate dielectric portion (42A, 42B) does not contact any sidewall surface of the pedestal portion, P, of the oxide structures (30A, 30B).

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a first silicon fin of a first height and located on a pedestal portion of a first oxide structure;
a second silicon fin of a second height and located on a pedestal portion of a second oxide structure, wherein each of said first oxide structure and said second oxide structure includes a base portion located beneath said pedestal portion and wherein a topmost surface of said pedestal portion of said second oxide structure is coplanar with a topmost surface of said base portion of said first oxide structure, and said first oxide structure and said second oxide structure are interconnected and said second oxide structure has a bottommost surface that is located beneath a bottommost surface of said first oxide structure, and wherein said second height of said second silicon fin is greater than said first height of said first silicon fin, yet a topmost surface of said first silicon fin is coplanar with a topmost surface of said second silicon fin;
a boron doped silicon portion of a second dopant concentration located directly beneath said first oxide structure and said second oxide structure, wherein said first and second silicon fins are also composed of boron doped silicon of said second dopant concentration; and
a silicon base layer having a p type conductivity and of first dopant concentration located beneath said boron doped silicon portion, wherein said first dopant concentration is greater than the second dopant concentration.

2. The semiconductor structure of claim 1, wherein a topmost surface of said boron doped silicon portion located in a first device region containing said first silicon fin is located above a topmost surface of said boron doped silicon portion located in a second device region containing said second silicon fin.

3. The semiconductor structure of claim 2, wherein said silicon base layer has an entirely planar topmost surface.

4. The semiconductor structure of claim 1, further comprising an isolation structure located on exposed surfaces of said first oxide structure and said second oxide structure, wherein each isolation structure in a first device region has at least one sidewall surface that contacts a sidewall surface of said pedestal portion of said first oxide structure and a topmost surface that is coplanar with a topmost surface of said pedestal portion of said first oxide structure, and wherein each isolation structure in a second device region has at least one sidewall surface that contacts a sidewall surface of said pedestal portion of said second oxide structure and a topmost surface that is coplanar with said topmost surface of said pedestal portion of said second oxide structure.

5. The semiconductor structure of claim 1, wherein said base portion has a width that is greater than a width of each pedestal portion.

6. The semiconductor structure of claim 1, wherein said pedestal portion of said first oxide structure is vertically coincident with sidewall surfaces of said first silicon fin, and said pedestal portion of second oxide structure is vertically coincident with sidewall surfaces of said second silicon fin.

7. The semiconductor structure of claim 1, further comprising a first functional gate structure straddling said first silicon fin, and a second functional gate structure straddling said second silicon fin.

8. The semiconductor structure of claim 7, wherein said first functional gate structure has a topmost surface that is coplanar a topmost surface of said second functional gate structure.

9. The semiconductor structure of claim 1, wherein said p-type conductivity of said silicon base layer is provided by a boron dopant.

10. The semiconductor structure of claim 1, wherein said first dopant concentration of said silicon base layer is from $5 \times 10^{18}$ atoms/cm$^3$ to $1 \times 10^{20}$ atoms/cm$^3$ and said second dopant concentration of said boron doped silicon portion is from $1 \times 10^{18}$ atoms/cm$^3$ to $5 \times 10^{18}$ atoms/cm$^3$.

11. The semiconductor structure of claim 1, wherein said boron doped silicon portion has an epitaxial relationship with said silicon base layer.

12. The semiconductor structure of claim 1, further comprising additional first silicon fins of said first height, each additional first silicon fin is present on an additional pedestal portion of said first oxide structure.

13. The semiconductor structure of claim 12, further comprising additional second silicon fins of said second height, each additional second silicon fin is present on an additional pedestal portion of said second oxide structure.

14. A semiconductor structure comprising:
a first silicon fin of a first height and located on a pedestal portion of a first oxide structure;
a second silicon fin of a second height and located on a pedestal portion of a second oxide structure, wherein each of said first oxide structure and said second oxide structure includes a base portion located beneath said pedestal portion and wherein a topmost surface of said pedestal portion of said second oxide structure is coplanar with a topmost surface of said base portion of said first oxide structure, and said first oxide structure and said second oxide structure are interconnected and said second oxide structure has a bottommost surface that is located beneath a bottommost surface of said first oxide structure, and wherein said second height of said second silicon fin is greater than said first height of said first silicon fin, yet a topmost surface of said first silicon fin is coplanar with a topmost surface of said second silicon fin;
a boron doped silicon portion of a second dopant concentration located directly beneath said first oxide structure and said second oxide structure, wherein said first and second silicon fins are also composed of boron doped silicon of said second dopant concentration;
a silicon base layer having a p type conductivity and of first dopant concentration located beneath said boron doped silicon portion, wherein said first dopant concentration is greater than the second dopant concentration; and
a first functional gate structure straddling said first silicon fin, and a second functional gate structure straddling said second silicon fin, wherein said first functional gate structure extends along sidewalls of said pedestal portion of said first oxide structure and along a topmost surface of said first oxide structure, and wherein said second functional gate structure extends along sidewalls of said pedestal portion of said second oxide structure and along a topmost surface of said second oxide structure.

15. The semiconductor structure of claim 14, wherein a topmost surface of said boron doped silicon portion located in a first device region containing said first silicon fin is located above a topmost surface of said boron doped silicon portion located in a second device region containing said second silicon fin.

16. The semiconductor structure of claim 15, wherein said silicon base layer has an entirely planar topmost surface.

17. A semiconductor structure comprising:
a first silicon fin of a first height and located on a pedestal portion of a first oxide structure;
a second silicon fin of a second height and located on a pedestal portion of a second oxide structure, wherein said first oxide structure and said second oxide structure are interconnected and said second oxide structure has a bottommost surface that is located beneath a bottommost surface of said first oxide structure, and wherein said second height of said second silicon fin is greater than said first height of said first silicon fin, yet a topmost surface of said first silicon fin is coplanar with a topmost surface of said second silicon fin;
a boron doped silicon portion of a second dopant concentration located directly beneath said first oxide structure and said second oxide structure, wherein said first and second silicon fins also comprise boron doped silicon of said second dopant concentration;
a silicon base layer having a p-type conductivity and of first dopant concentration located beneath said boron doped silicon portion, wherein said first dopant concentration is greater than the second dopant concentration;
an isolation structure located on exposed surfaces of said first oxide structure and said second oxide structure, wherein each isolation structure in a first device region has at least one sidewall surface that contacts a sidewall surface of said pedestal portion of said first oxide structure and a topmost surface that is coplanar with a topmost surface of said pedestal portion of said first oxide structure, and wherein each isolation structure in a second device region has at least one sidewall surface that contacts a sidewall surface of said pedestal portion of said second oxide structure and a topmost surface that is coplanar with a topmost surface of said pedestal portion of said second oxide structure; and
a first functional gate structure straddling said first silicon fin, and a second functional gate structure straddling said second silicon fin, wherein said first functional gate structure extends along a topmost surface of said isolation structure in said first device region, and wherein said second functional gate structure extends along a topmost surface of said isolation structure is said second device region.

18. The semiconductor structure of claim 17, wherein a topmost surface of said boron doped silicon portion located in a first device region containing said first silicon fin is located above a topmost surface of said boron doped silicon portion located in a second device region containing said second silicon fin.

19. The semiconductor structure of claim 17, wherein said silicon base layer has an entirely planar topmost surface.

* * * * *